(12) United States Patent
Zang et al.

(10) Patent No.: US 10,892,338 B2
(45) Date of Patent: Jan. 12, 2021

(54) SCALED GATE CONTACT AND SOURCE/DRAIN CAP

(71) Applicant: GLOBALFOUNDRIES INC., Grand Cayman (KY)

(72) Inventors: Hui Zang, Guilderland, NY (US); Ruilong Xie, Niskayuna, NY (US); Jae Gon Lee, Waterford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 44 days.

(21) Appl. No.: 16/169,269

(22) Filed: Oct. 24, 2018

(65) Prior Publication Data

US 2020/0135872 A1 Apr. 30, 2020

(51) Int. Cl.
*H01L 29/417* (2006.01)
*H01L 29/08* (2006.01)
(Continued)

(52) U.S. Cl.
CPC .. *H01L 29/41775* (2013.01); *H01L 21/76808* (2013.01); *H01L 21/76816* (2013.01); *H01L 21/76834* (2013.01); *H01L 21/76852* (2013.01); *H01L 21/76877* (2013.01); *H01L 21/76885* (2013.01); *H01L 23/528* (2013.01); *H01L 23/5221* (2013.01); *H01L 23/5283* (2013.01); *H01L 29/0847* (2013.01);
(Continued)

(58) Field of Classification Search
CPC ........... H01L 29/0653; H01L 29/66545; H01L 29/76831; H01L 29/76877; H01L 29/76885; H01L 29/76834; H01L 29/66795; H01L 29/42376; H01L 21/76879; H01L 21/76838; H01L 21/76808; H01L 21/76877; H01L 21/76885; H01L 21/76831; H01L 21/76834

See application file for complete search history.

(56) References Cited

U.S. PATENT DOCUMENTS 9,324,656 B1 * 4/2016 Labonte ............ H01L 21/76831
9,461,143 B2 10/2016 Pethe et al.
(Continued)

FOREIGN PATENT DOCUMENTS

TW 201724520 7/2017
TW I623058 5/2018

OTHER PUBLICATIONS

Taiwanese Office Action and Search Report in TW related Application No.108134251 dated May 28, 2020, 14 pages.

*Primary Examiner* — Sophia T Nguyen
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to a scaled gate contact and source/drain cap and methods of manufacture. The structure includes: a gate structure comprising an active region; source and drain contacts adjacent to the gate structure; a capping material over the source and drain contacts; a gate contact formed directly above the active region of the gate structure and over the capping material; a U-shape dielectric material around the gate contact, above the source and drain contacts; and a contact in direct electrical contact to the source and drain contacts.

19 Claims, 4 Drawing Sheets

(51) Int. Cl.
*H01L 29/51* (2006.01)
*H01L 29/78* (2006.01)
*H01L 29/66* (2006.01)
*H01L 23/528* (2006.01)
*H01L 21/768* (2006.01)
*H01L 23/522* (2006.01)

(52) U.S. Cl.
CPC ...... *H01L 29/517* (2013.01); *H01L 29/66795* (2013.01); *H01L 29/7851* (2013.01)

(56) References Cited

U.S. PATENT DOCUMENTS

| | | | | |
|---|---|---|---|---|
| 9,508,825 | B1* | 11/2016 | Basker | H01L 29/665 |
| 9,536,982 | B1* | 1/2017 | Cheng | H01L 29/41791 |
| 9,589,833 | B1* | 3/2017 | Cheng | H01L 21/76831 |
| 9,666,533 | B1* | 5/2017 | Basker | H01L 21/76897 |
| 9,691,897 | B2 | 6/2017 | Xie et al. | |
| 9,929,048 | B1* | 3/2018 | Xie | H01L 21/76897 |
| 10,026,824 | B1* | 7/2018 | Chanemougame | H01L 21/764 |
| 10,083,863 | B1* | 9/2018 | Hsieh | H01L 21/31116 |
| 10,236,215 | B1* | 3/2019 | Xie | H01L 23/528 |
| 10,236,364 | B1* | 3/2019 | Cheng | H01L 29/0847 |
| 10,243,053 | B1* | 3/2019 | Xie | H01L 21/28123 |
| 10,347,541 | B1* | 7/2019 | Shu | H01L 21/76834 |
| 10,388,770 | B1* | 8/2019 | Xie | H01L 29/41775 |
| 10,431,495 | B1* | 10/2019 | Cheng | H01L 29/41791 |
| 10,522,632 | B2* | 12/2019 | Zhou | H01L 21/764 |
| 10,529,704 | B1* | 1/2020 | Cimino | H01L 29/785 |
| 10,529,826 | B1* | 1/2020 | Frougier | H01L 21/76897 |
| 2003/0077891 | A1* | 4/2003 | Drynan | H01L 21/28525 438/618 |
| 2010/0102389 | A1* | 4/2010 | Muller | H01L 29/6681 257/347 |
| 2011/0156107 | A1* | 6/2011 | Bohr | H01L 21/28229 257/288 |
| 2014/0339629 | A1* | 11/2014 | Xie | H01L 29/7827 257/330 |
| 2015/0270359 | A1* | 9/2015 | Basker | H01L 21/76831 438/151 |
| 2016/0005851 | A1* | 1/2016 | Song | H01L 27/0207 257/401 |
| 2016/0064514 | A1* | 3/2016 | Bouche | H01L 29/66545 257/401 |
| 2016/0133623 | A1* | 5/2016 | Xie | H01L 29/66545 257/384 |
| 2016/0293485 | A1* | 10/2016 | Song | H01L 21/76897 |
| 2016/0293725 | A1* | 10/2016 | Liou | H01L 29/66545 |
| 2016/0336183 | A1* | 11/2016 | Yuan | H01L 29/401 |
| 2016/0359009 | A1* | 12/2016 | Xie | H01L 23/535 |
| 2016/0365426 | A1* | 12/2016 | Ching | H01L 29/785 |
| 2016/0379925 | A1* | 12/2016 | Ok | H01L 21/76802 257/288 |
| 2017/0054004 | A1* | 2/2017 | Cheng | H01L 29/66553 |
| 2017/0110549 | A1* | 4/2017 | Xie | H01L 27/0886 |
| 2017/0170320 | A1 | 6/2017 | Chang et al. | |
| 2017/0194211 | A1* | 7/2017 | Lai | H01L 29/41791 |
| 2017/0317076 | A1* | 11/2017 | Shen | H01L 21/76831 |
| 2018/0047634 | A1* | 2/2018 | Jun | H01L 29/66545 |
| 2018/0076040 | A1* | 3/2018 | Ando | H01L 29/513 |
| 2018/0096932 | A1* | 4/2018 | Xie | H01L 23/5283 |
| 2018/0114846 | A1* | 4/2018 | Alptekin | H01L 29/0649 |
| 2018/0138279 | A1* | 5/2018 | Xie | H01L 29/6653 |
| 2018/0174904 | A1* | 6/2018 | Hsieh | H01L 29/785 |
| 2018/0240883 | A1* | 8/2018 | Chanemougame | H01L 29/4991 |
| 2018/0277430 | A1* | 9/2018 | Xie | H01L 29/4991 |
| 2018/0286956 | A1* | 10/2018 | Xie | H01L 29/42376 |
| 2018/0286959 | A1* | 10/2018 | Wang | H01L 29/785 |
| 2018/0301559 | A1* | 10/2018 | Liaw | H01L 27/0886 |
| 2018/0315821 | A1* | 11/2018 | Xie | H01L 29/0847 |
| 2019/0006515 | A1* | 1/2019 | Cheng | H01L 29/41791 |
| 2019/0035692 | A1* | 1/2019 | Xie | H01L 27/088 |
| 2019/0096677 | A1* | 3/2019 | Xie | H01L 21/28 |
| 2019/0097016 | A1* | 3/2019 | Alptekin | H01L 29/66795 |
| 2019/0115444 | A1* | 4/2019 | Bentley | H01L 29/66545 |
| 2019/0131171 | A1* | 5/2019 | Gwak | H01L 23/5226 |
| 2019/0157158 | A1* | 5/2019 | Leobandung | H01L 23/485 |
| 2019/0181042 | A1* | 6/2019 | Xie | H01L 21/76897 |
| 2019/0287902 | A1* | 9/2019 | Liaw | H01L 29/7851 |
| 2019/0355619 | A1* | 11/2019 | Chan | H01L 21/31144 |
| 2019/0355838 | A1* | 11/2019 | Zang | H01L 27/0886 |
| 2019/0393321 | A1* | 12/2019 | Xu | H01L 29/513 |
| 2020/0058757 | A1* | 2/2020 | Xie | H01L 27/0886 |
| 2020/0066597 | A1* | 2/2020 | Cheng | H01L 21/76832 |
| 2020/0135872 | A1* | 4/2020 | Zang | H01L 29/7851 |
| 2020/0135886 | A1* | 4/2020 | Greene | H01L 29/6656 |
| 2020/0176324 | A1* | 6/2020 | Zang | H01L 29/0847 |
| 2020/0287039 | A1* | 9/2020 | Bi | H01L 29/41791 |

\* cited by examiner

SCALED GATE CONTACT AND SOURCE/DRAIN CAP

FIELD OF THE INVENTION

The present disclosure relates to semiconductor structures and, more particularly, to a scaled gate contact and source/drain cap and methods of manufacture.

BACKGROUND

Integrated circuit (IC) structures have middle of the line (MOL) contacts that connect the semiconductor devices to back end of the line (BEOL) metal levels. For example, a field effect transistor (FET) can have a gate contact (CB contact) which extends vertically through interlayer dielectric (ILD) material from a metal wire or via in the first back end of the line (BEOL) metal level ($M_0$) to the gate of the FET. The FET also has source/drain contacts (CA contacts) which extend vertically through the ILD material from metal wires or vias in the BEOL metal level to metal plugs (TS contacts), which are on the source/drain regions of the FET.

In order to avoid shorts between the gate contact and the metal plugs, the gate contact is formed on a portion of the gate that is offset from the active region of the FET and, more particularly, on a portion of the gate that extends laterally over the adjacent isolation region. However, given the ever present need for size scaling of devices, it is advantageous to provide a gate contact formed on a portion of the gate directly above the active region (CB-over-active or CBoA), while still ensuring that the risk of a short developing between the gate contact and any of the metal plugs is avoided (or at least significantly reduced).

SUMMARY

In an aspect of the disclosure, a structure comprises: a gate structure comprising an active region; source and drain contacts adjacent to the gate structure; a capping material over the source and drain contacts; a gate contact formed directly above the active region of the gate structure and over the capping material; a U-shape dielectric material around the gate contact, above the source and drain contacts; and a contact in direct electrical contact to the source and drain contacts.

In an aspect of the disclosure, a structure comprises: a gate contact over an active region of a gate structure; a spacer on a sidewall of the gate contact; a lower source/drain contact in electrical contact with source and drain regions of the gate structure; an upper source/drain contact above and in direct contact with the lower source/drain contact; a source/drain cap underneath a portion of the gate contact, over a lower source/drain contact and adjacent to an upper source/drain contact; and a contact to the upper source/drain contact.

In an aspect of the disclosure, a method comprising: forming a lower source and drain contact; forming a lower source and drain contact cap over the lower source and drain contact; forming a gate contact placeholder; forming a spacer about a sidewall of the gate contact placeholder; recessing the lower source and drain contact cap where it is not covered by the gate contact placeholder or the spacer; forming an upper source and drain contact in the recess; removing the gate contact placeholder to form an opening which exposes an active region of a gate structure; and forming a gate contact in the opening, directly in contact with the exposed active region of the gate structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a scaled gate contact and source/drain cap and methods of manufacture. More specifically, the present disclosure is directed to a self-aligned scaled gate contact over an active region (CBoA). For example, the present disclosure provides a scheme to only have recessed source/drain contacts around the CBoA region. Advantageously, the present disclosure provides reduced gate contact resistance and reduced source/drain contact resistance, while also defining a minimum area for a source/drain cap without introducing any new masks.

In embodiments, the method of forming the gate contacts, e.g., middle of line (MOL) contacts, comprises: forming lower source/drain contacts and a contact cap; forming a gate contact placeholder; forming a spacer at a sidewall of the gate contact placeholder; recessing the lower source/drain contact cap where it is not covered by a gate contact placeholder or spacer; forming an upper source/drain contact in the recessed lower source/drain contact cap region; removing the gate contact placeholder; patterning additional contacts to the upper source/drain contacts; and a metallization process. The structure comprises, for example: a gate contact over active region; a spacer at the sidewall of the gate contact over active region with a source/drain contact cap underneath; a U-shape dielectric layer around the gate contact and above source/drain contact and a source/drain contact over the upper source/drain, where there is no cap. The U-shape dielectric layer will isolate the gate contact from source and drain contacts.

The scaled gate contact and source/drain cap of the present disclosure can be manufactured in a number of ways using a number of different tools. In general, though, the methodologies and tools are used to form structures with dimensions in the micrometer and nanometer scale. The methodologies, i.e., technologies, employed to manufacture the scaled gate contact and source/drain cap of the present disclosure have been adopted from integrated circuit (IC) technology. For example, the structures are built on wafers and are realized in films of material patterned by photolithographic processes on the top of a wafer. In particular, the fabrication of the scaled gate contact and source/drain cap uses three basic building blocks: (i) deposition of thin films of material on a substrate, (ii) applying a patterned mask on top of the films by photolithographic imaging, and (iii) etching the films selectively to the mask.

Figure 1A:
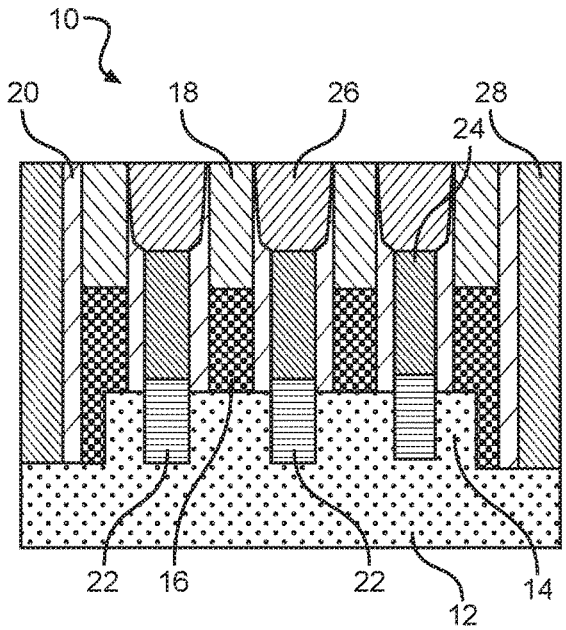
FIG. 1A is a cross-sectional view across a gate contact region of a gate structure with source/drain regions, amongst other features, and respective fabrication processes in accordance with aspects of the present disclosure.
Figure 1B:
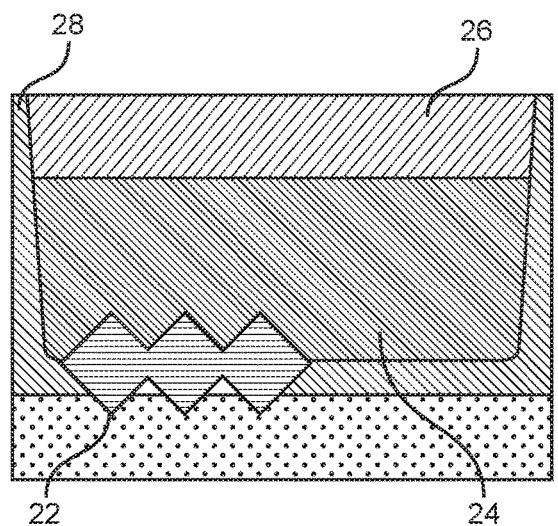
FIG. 1B is a cross-sectional view across a source contact region, amongst other features, and respective fabrication processes in accordance with aspects of the present disclosure.

FIGS. 1A and 1B show cut-away views of a gate structure with source and drain contacts, amongst other features, and respective fabrication processes in accordance with aspects of the present disclosure. More specifically, the structure 10 shown in FIGS. 1A and 1B includes a substrate 12 composed of Si; although other substrates are also contemplated herein. For example, the substrate 12 may be composed of any suitable material including, but not limited to, Si, SiGe, SiGeC, SiC, GaAs, InAs, InP, and other III/V or II/VI compound semiconductors.

In embodiments, the substrate 12 can be a planar structure (for planar devices) or fabricated into fin structures (for finFET devices) using a conventional sidewall image technique or other conventional lithography and etching processes. In the SIT technique, for example, a mandrel, e.g., $SiO_2$, is deposited on the substrate 12 using conventional CVD processes. A resist is formed on the mandrel material and exposed to light to form a pattern (openings). A reactive ion etching (RIE) is performed through the openings to form the mandrels. Spacers are formed on the sidewalls of the mandrels which are preferably material that is different than the mandrels, and which are formed using conventional deposition processes known to those of skill in the art. The spacers can have a width which matches the dimensions of the fin structures, for example. The mandrels are removed or stripped using a conventional etching process, selective to the mandrel material. An etching is then performed within the spacing of the spacers to form the sub-lithographic features. The sidewall spacers can then be stripped.

Shallow trench isolation (STI) structures 14 are formed in the substrate 12 to isolate a plurality of gate structures 16. In embodiments, the STI structures 14 can be formed by conventional lithography, etching and deposition methods known to those of skill in the art. For example, a resist formed over substrate 12 is exposed to energy (light) to form a pattern (opening). An etching process with a selective chemistry, e.g., RIE, will be used to form one or more trenches in the substrate 12 through the openings of the resist. The resist can then be removed by a conventional oxygen ashing process or other known stripants. Following the resist removal, insulator material, e.g., oxide, can be deposited by any conventional deposition processes, e.g., chemical vapor deposition (CVD) processes. Any residual material on the surface of the substrate 12 can be removed by conventional chemical mechanical polishing (CMP) processes.

Still referring to FIGS. 1A and 1B, a plurality of gate structures 16 are formed on the substrate 14. In embodiments, the plurality of gate structures 16 are formed by conventional gate last processes or gate first processes. For example, in the gate first processes, the fabrication includes e.g., deposition of dielectric material, gate metal(s) (e.g., workfunction metals) and a capping material 18, followed by a patterning process. In embodiments, the dielectric material can be a high-k gate dielectric material, e.g., $HfO_2$ $Al_2O_3$, $Ta_2O_5$, $TiO_2$, $La_2O_3$, $SrTiO_3$, $LaAlO_3$, $ZrO_2$, $Y_2O_3$, $Gd_2O_3$, and combinations including multilayers thereof. The gate metals can be any gate metals or combinations thereof used for NFET or PFET devices, e.g., tungsten. The capping material 18 can be, e.g., SiN. A sidewall spacer 20, e.g., SiCON material, is deposited on the sidewalls of the patterned gate structure 16 and capping material 18 using a conventional deposition process, e.g., chemical vapor deposition (CVD), followed by an anisotropic etching process.

FIGS. 1A and 1B further show source and drain regions 22 formed on the substrate 12, adjacent to the sidewall spacers 20. The source and drain regions 22 can be raised epitaxial source and drain regions formed by an epitaxial growth process, e.g., doped with boron or phosphorous. More specifically, the source and drain regions 22 can be epitaxial Si material doped with phosphorous for a NFET or epitaxial SiGe material doped with boron for a PFET.

In embodiments, the source and drain regions 22 can include silicide regions. As should be understood by those of skill in the art, the silicide process begins with deposition of a thin transition metal layer, e.g., nickel, cobalt or titanium, over fully formed and patterned semiconductor devices (e.g., doped or ion implanted source and drain regions 22). After deposition of the material, the structure is heated allowing the transition metal to react with exposed silicon (or other semiconductor material as described herein) in the active regions of the semiconductor device (e.g., source and drain regions) forming a low-resistance transition metal silicide. Following the reaction, any remaining transition metal is removed by chemical etching, leaving silicide contacts in the active regions of the device, e.g., source and drain regions 22. It should be understood by those of skill in the art that silicide contacts will not be required on the metal gate structures.

A lower source/drain contact metal 24 (e.g., metal plug (TS contact)) is deposited on the silicide of the source and drain regions 22. In embodiments, the lower source/drain contact metal 24 can be any suitable metal material used for a lower source/drain contact. For example, the lower source/drain contact metal 24 can be, e.g., tungsten, cobalt, ruthenium, copper, or any other suitable conductive material. The lower source/drain contact metal 24 is recessed by a selective timed etching process, e.g., maskless process. A source/drain capping material 26 is formed within the recess, e.g., above the recessed lower source/drain contact metal 24. In embodiments, the capping material can be SiC, SiCO, $SiO_2$, as an example. The structures described herein are surrounded by an interlevel dielectric material 28, e.g., oxide material.

Figure 2A:
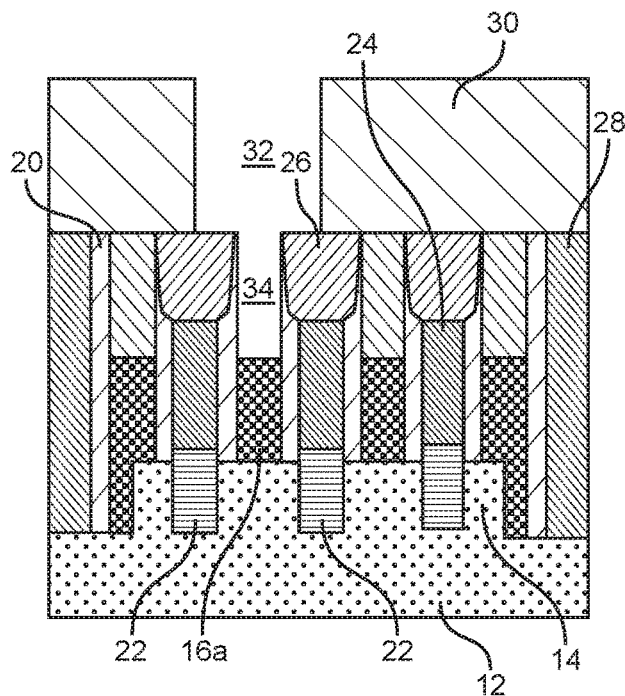
FIG. 2A is a cross-sectional view across the gate contact region which shows an opening for a gate contact, amongst other features, and respective fabrication processes in accordance with aspects of the present disclosure.
Figure 2B:
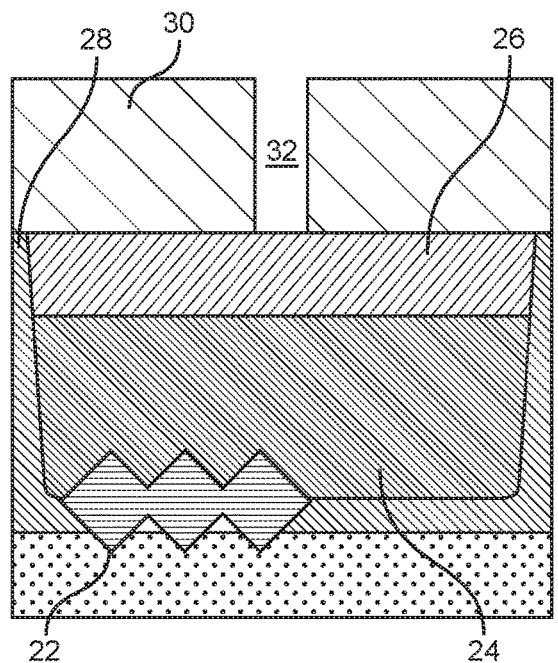
FIG. 2B is a cross-sectional view across the source contact region which shows the opening for the gate contact, amongst other features, and respective fabrication processes in accordance with aspects of the present disclosure

FIGS. 2A and 2B show cut-away views of an opening for a gate contact, amongst other features, and respective fabrication processes in accordance with aspects of the present disclosure. As shown in FIGS. 2A and 2B, a coating 30 is deposited over the structure of FIGS. 1A-1B, followed by a conventional patterning process aligned with the gate structure 16a. In embodiments, the coating 30 is an organic planarization layer (OPL) which is patterned using a conventional lithography and etching process to form an opening 32 aligned with the gate structure 16a. The capping material of the gate structure 16a is removed (e.g., etched though the opening 32) to form an opening 34 which is self-aligned with and exposes the metal material of the gate structure 16a. In embodiments, the opening 34 extends to below an upper surface of the sidewall spacer 20.

Figure 3A:
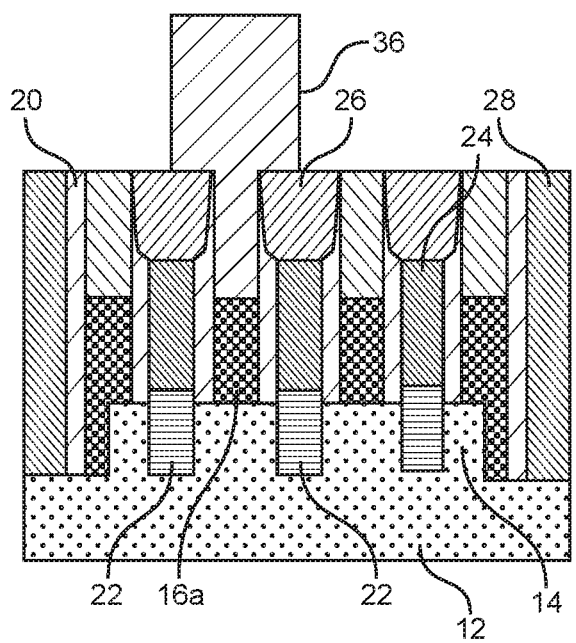
FIG. 3A is a cross-sectional view across the gate contact region which shows a sacrificial gate contact, amongst other features, and respective fabrication processes in accordance with aspects of the present disclosure.
Figure 3B:
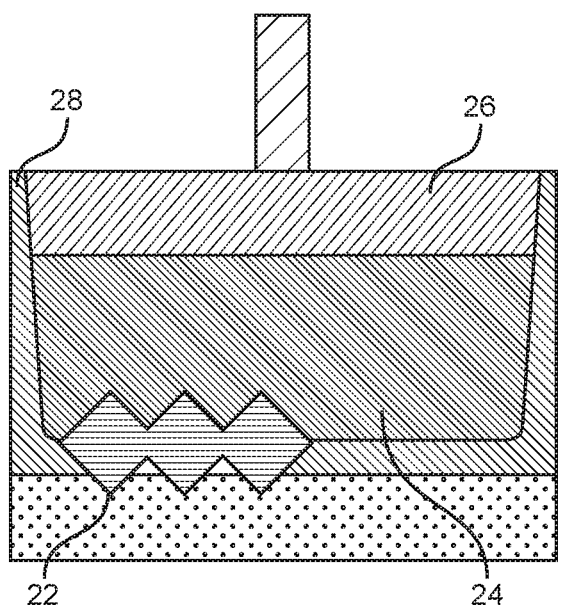
FIG. 3B is a cross-sectional view across the source contact region which shows the sacrificial gate contact, amongst other features, and respective fabrication processes in accordance with aspects of the present disclosure

FIGS. 3A and 3B show cut-away views of an sacrificial material (e.g., placeholder) for a gate contact, amongst other features, and respective fabrication processes in accordance with aspects of the present disclosure. As shown in FIGS. 3A and 3B, a sacrificial material 36 is deposited in the openings 32, 34 (shown in FIGS. 2A, 2B) in direct contact with the metal material of the gate structure 16a. The sacrificial material 36 will form a placeholder for the gate contact, which is provided in subsequent fabrication processes. In embodiments, the sacrificial material 36 is SiN deposited by a conventional deposition process, e.g., CVD. Following the deposition of the material 36, the OPL material is removed by a conventional ashing process.

Figure 4A:
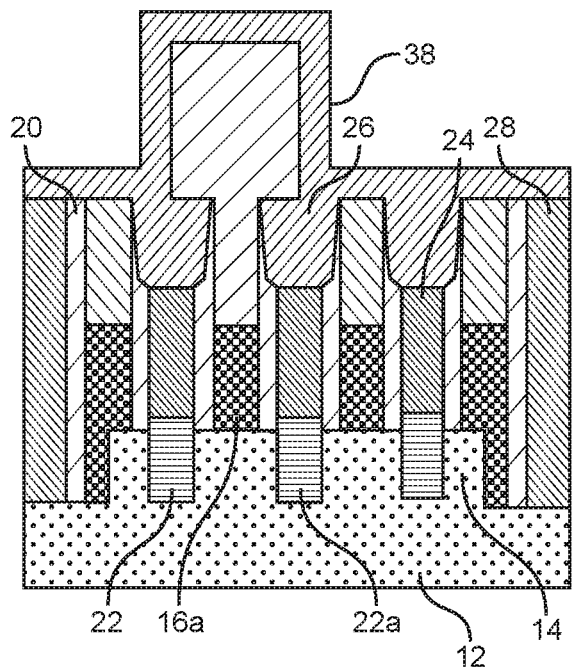
FIG. 4A is a cross-sectional view across the gate contact region which shows a liner material on the sacrificial gate contact, amongst other features, and respective fabrication processes in accordance with aspects of the present disclosure.
Figure 4B:
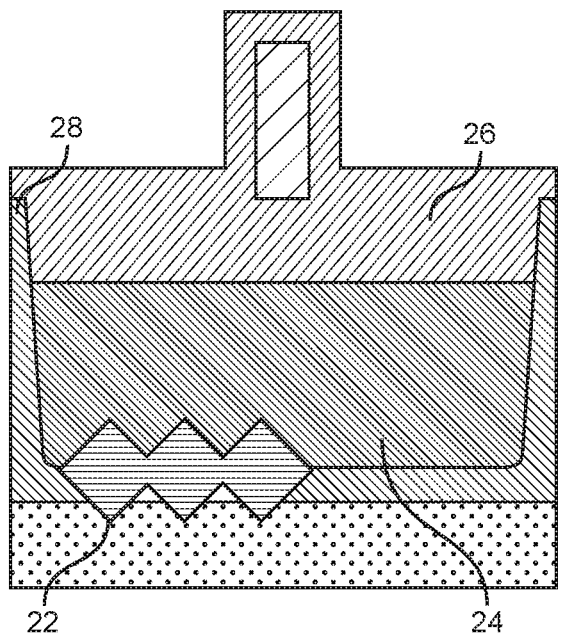
FIG. 4B is a cross-sectional view across the source contact region which shows the liner on the sacrificial gate contact, amongst other features, and respective fabrication processes in accordance with aspects of the present disclosure
Figure 5A:
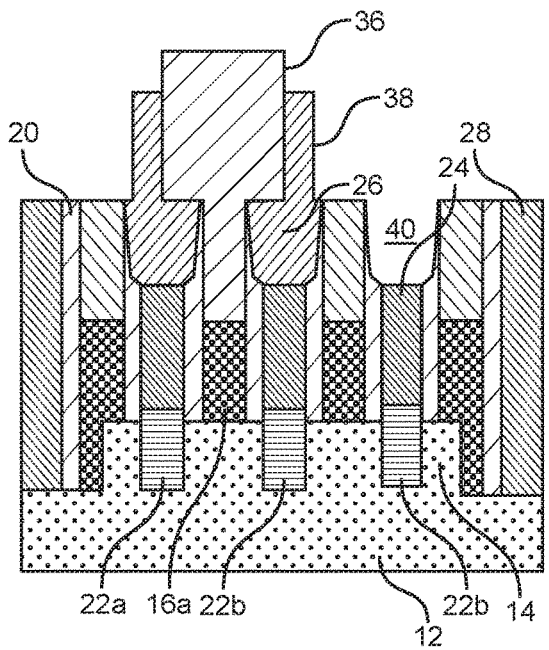
FIG. 5A is a cross-sectional view across the gate contact region which shows a placeholder for the gate contact, amongst other features, and respective fabrication processes in accordance with aspects of the present disclosure.
Figure 5B:
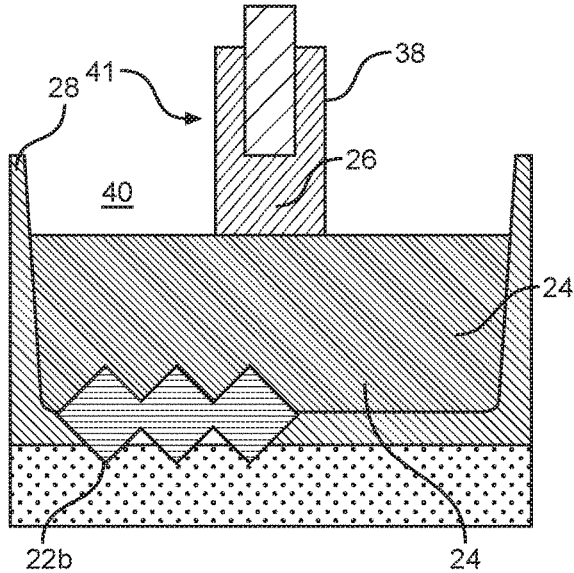
FIG. 5B is a cross-sectional view across the source contact region which shows a placeholder for the gate contact, amongst other features, and respective fabrication processes in accordance with aspects of the present disclosure.

FIGS. 4A and 4B show a cross-sectional view across a liner material over the sacrificial material (e.g., placeholder) for the gate contact, amongst other features, and respective fabrication processes in accordance with aspects of the present disclosure. As shown in FIGS. 4A and 4B, a liner material (e.g., spacer material) 38 is conformally deposited on the structure, e.g., deposited on the gate contact placeholder 36. In embodiments, the liner material 38 can be deposited by a conventional blanket deposition process, e.g., CVD process. In embodiments, the liner material 38 will be deposited to a thickness of, e.g., 5 nm to 10 nm, which ensures coverage remains over the capping material 26 of the source and drain regions 22 after the anisotropic etching process as shown in FIGS. 5A and 5B. The liner material 38 can be SiC, SiCO or $SiO_2$ as examples.

As further shown in FIGS. 5A and 5B, the anisotropic etching process will partially recess the liner material 38 from sidewalls of the placeholder 36, in addition to removing (over-etching) the exposed capping material 26 above the lower source/drain contact metal 24 of the source and drain regions 22b. In embodiments, the removal of the capping material 26 over the source and drain regions 22b will form a recess 40 of about 20 nm, exposing the lower source/drain contact metal 24. In embodiments, the recess 40 can be other dimensions depending on the technology node and the original depth of the capping material 26.

As also shown in FIG. 5B, the combination of the capping material 26 and the liner material 38 will form a U-shaped cap of dielectric material 41 around the gate contact, above the lower source/drain contact metal 24. The U-shape cap 41 will isolate the gate contact 46 (as shown in FIG. 7A) from source and drain contacts 24, 42.

Figure 6A:
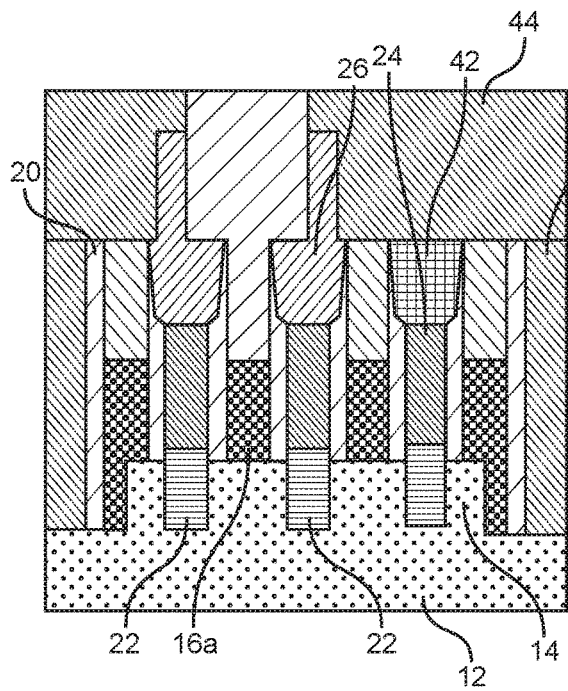
FIG. 6A is a cross-sectional view across the gate contact region which shows source and drain contact regions, amongst other features, and respective fabrication processes in accordance with aspects of the present disclosure.
Figure 6B:
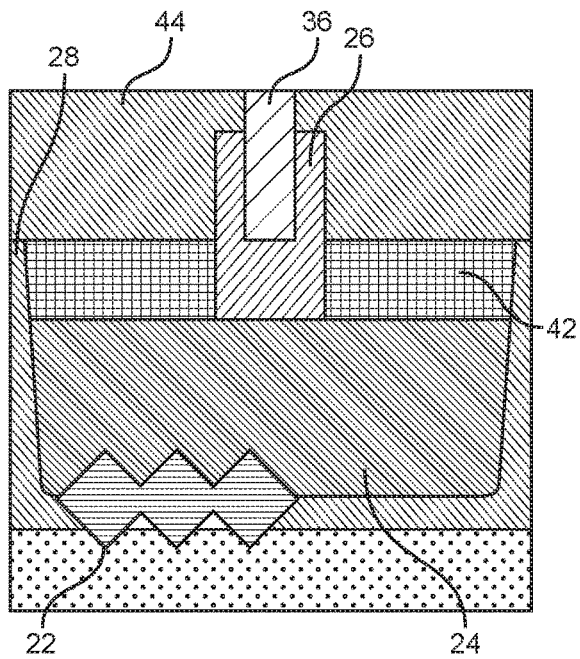
FIG. 6B is a cross-sectional view across the source contact region which shows the source and drain contact regions, amongst other features, and respective fabrication processes in accordance with aspects of the present disclosure.

FIGS. 6A and 6B show cut-away views of a source and drain contact, amongst other features, and respective fabrication processes in accordance with aspects of the present disclosure. As shown in FIGS. 6A and 6B, a metal material (upper source/drain contact metal) 42 is selectively grown over the exposed metal material of the lower source/drain contact metal 24, within the recess 40. In this way, the source and drain contacts will be composed of the lower source/drain contact metal 24 and the upper source/drain contact metal 42 (in direct electric contact with the lower source/drain contact metal 24). The capping material 26, e.g., above the recessed lower source/drain contact metal 24, will now be adjacent and between the upper source/drain contact metal 42. Also, a bottom surface of the capping material 26 is substantially co-planner with a bottom surface of the upper source/drain contact metal 42.

In embodiments, the upper source/drain contact metal 42 can be, e.g., Co, W, or Ru. In alternative embodiments, the upper source/drain contact metal 42 can be deposited by a metal overfill process. An interlevel dielectric material 44, e.g., oxide based material, is deposited over the upper source/drain contact metal 42. The interlevel dielectric material 44 can be deposited by a conventional deposition process, e.g., CVD, followed by a planarization process, e.g., chemical mechanical polishing (CMP).

Figure 7A:
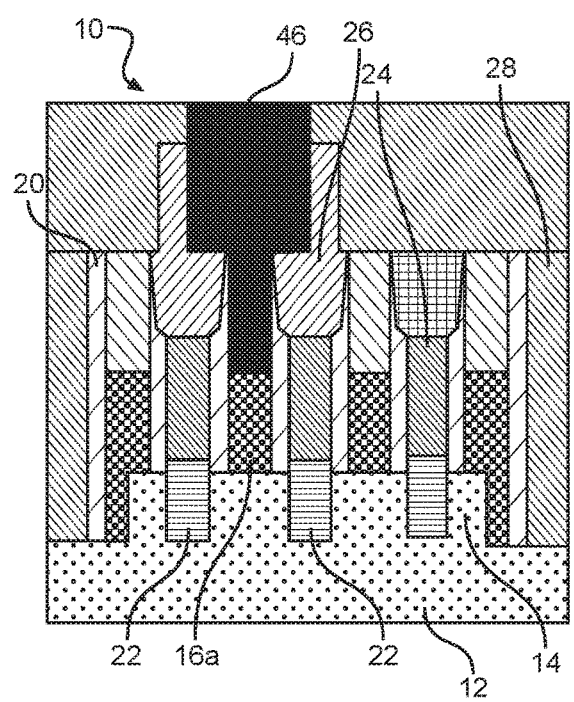
FIG. 7A is a cross-sectional view across the gate contact region which shows a gate contact, amongst other features, and respective fabrication processes in accordance with aspects of the present disclosure.
Figure 7B:
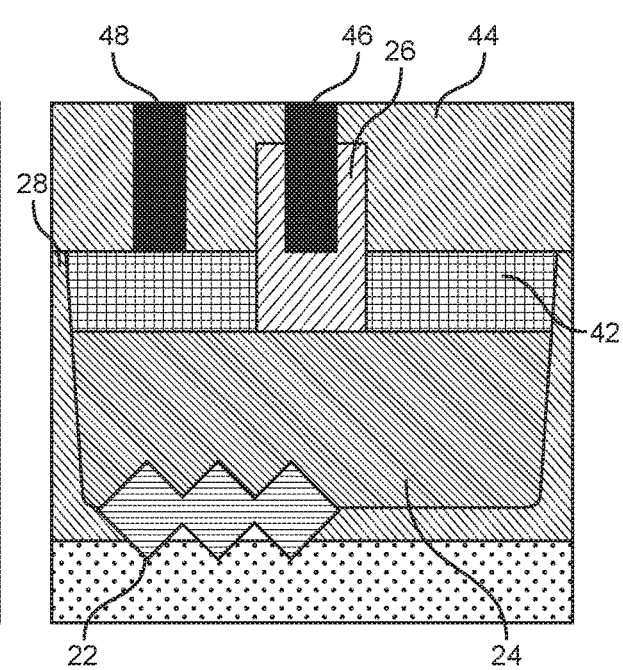
FIG. 7B is a cross-sectional view across the source contact region which shows the gate contact and source/ drain contact, amongst other features, and respective fabrication processes in accordance with aspects of the present disclosure.

FIGS. 7A and 7B show cut-away views of a gate contact and source/drain contact, amongst other features, and respective fabrication processes in accordance with aspects of the present disclosure. As shown in FIGS. 7A and 7B, the placeholder, e.g., material 36, is removed and replaced with a gate contact metal 46 over and in direct contact with the active region of the gate structure 16a. Due to the previous formation of the opening 36, the gate contact is a self-aligned contact directly above the active region of the gate structure 16a.

In embodiments, the gate contact metal 46 will extend to below an upper surface of the sidewall spacer 20, isolated from the source/drain contact metal 24 by both the capping material 26 and the sidewall spacers 20. In embodiments, the material 36 can be removed by a selective etching process. In addition, a middle of the line (MOL) source and drain contact 48 can be formed in direct contact with the upper source/drain contact metal 42. The liner material 38 will act as a spacer for the gate contact metal 46, above the capping material 26, e.g., above the recessed lower source/drain contact metal 24.

The MOL source and drain contact 48 can be formed by conventional lithography, etching and deposition processes. It should be understood that the material for the MOL source and drain contact 48 and gate contact metal 46 can be deposited in a single deposition process, after removal of the resist material used in the lithography process to form the opening in the interlevel dielectric material 44 of the MOL source and drain contact 48. The metal material can be any suitable metal material, e.g., copper. Any residual metal material on the interlevel dielectric material 44 can be removed by a CMP process.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a gate structure comprising an active region;
source and drain contacts adjacent to the gate structure;
a capping material over the source and drain contacts;
a gate contact formed directly above the active region of the gate structure and over the capping material;
a U-shape dielectric material around the gate contact, above the source and drain contacts, the U-shape dielectric material being formed from the capping material and a liner material; and
a contact in electrical contact to at least one of the source and drain contacts,
wherein the source and drain contacts include a lower contact and an upper contact and the capping material is over the lower contact, wherein:
the upper contact is above and in direct contact with the lower contact, and below the gate contact that extends over the source and drain regions, and
the U-shape dielectric material formed from the capping material and the liner material comprises a source/drain cap underneath a portion of the gate contact, wherein:
the liner material of the U-shape dielectric material extends on sidewalls of the gate contact above the upper contact and above the gate structure;
the source/drain cap comprises a lower surface that is above the gate structure and over the lower contact; and
the source/drain cap extends to within a portion of the upper contact; and the contact is to the upper contact and is remote from the gate contact that extends above the source and drain regions of the gate structure.

2. The structure of claim 1, wherein the contact is positioned remotely from the capping material.

3. The structure of claim 1, wherein the U-shape dielectric material isolates the gate contact from the source and drain contacts.

4. The structure of claim 3, wherein the U-shape dielectric material is SiC, SiCO or $SiO_2$.

5. The structure of claim 1, further comprising a sidewall spacer separating the gate contact and the source and drain contacts.

6. The structure of claim 5, wherein the capping material is above the sidewall spacer.

7. The structure of claim 6, wherein the sidewall spacer is a different material than the capping material.

8. The structure of claim 7, wherein the sidewall spacer is SiCON.

9. The structure of claim 1, wherein the lower contact and the upper contact are of a same material.

10. The structure of claim 1, wherein the source and drain contacts are in electrical contact with raised source and drain regions, adjacent to the gate structure.

11. A structure comprising:
a gate contact over an active region of a gate structure and above source and drain regions of the gate structure;
a spacer composed of liner material on a sidewall of the gate contact;
a lower source/drain contact in electrical contact with the source and drain regions of the gate structure;
an upper source/drain contact above and in contact with the lower source/drain contact, and below the gate contact that extends over the source and drain regions;
a source/drain cap underneath a portion of the gate contact, wherein:
the liner material of the spacer is above the source/drain cap and extends on sidewalls of the gate contact above the upper source/drain contact and above the gate structure,
the source/drain cap comprises a lower surface that is above the gate structure and over the lower source/drain contact, and
the source/drain cap extends to within a portion of the upper source/drain contact; and
a contact to the upper source/drain contact and which is remote from the gate contact that extends above the source and drain regions of the gate structure.

12. The structure of claim 11, wherein the spacer on the sidewall of the gate contact is in direct contact with the source/drain cap.

13. The structure of claim 12, wherein the spacer on the sidewall of the gate contact and the source/drain cap form a U-shape of dielectric material.

14. The structure of claim 13, wherein the U-shape of dielectric material isolates the gate contact from both the lower source/drain contact and the upper source/drain contact.

15. The structure of claim 13, wherein the U-shape of dielectric material is SiC, SiCO or $SiO_2$.

16. The structure of claim 13, further comprising sidewall spacers surrounding a lower portion of the gate contact.

17. The structure of claim 16, wherein the sidewall spacers are composed of SiCON.

18. The structure of claim 17, wherein a bottom surface of the source/drain cap is substantially co-planner with a bottom surface of the upper source/drain contact.

19. A method comprising:

forming a lower source and drain contact;

forming a lower source and drain contact cap over the lower source and drain contact;

forming a gate contact placeholder over a gate structure and a portion of the lower source and drain contact cap;

forming a spacer about a sidewall of the gate contact placeholder;

recessing portions of the lower source and drain contact cap where it is not covered by the gate contact placeholder or the spacer to expose a portion of the lower source and drain contact, while protecting portions of the upper source and drain contact cap covered by the gate contact placeholder or the spacer such as it remains intact;

forming an upper source and drain contact in the recess in contact with the lower source and drain contact, and adjacent to remaining portions of the lower source and drain contact cap which were protected by the gate contact placeholder or the spacer during the recessing;

removing the gate contact placeholder to form an opening which exposes an active region of the gate structure and which further forms a U-shaped cap above the lower source and drain contact; and forming a gate contact in the opening, directly in contact with the exposed active region of the gate structure and which extends within the U-shaped cap which isolates the gate contact from both the lower source and drain contact and the upper source and drain contact; and forming a contact to the upper source and drain contact and which is remote from both the gate contact in the opening and which extends within the U-shaped cap.

* * * * *